United States Patent [19]
Nam

[11] Patent Number: 5,929,685
[45] Date of Patent: Jul. 27, 1999

[54] MODE SETTING CIRCUIT

[75] Inventor: Ga-Pyo Nam, Taebaek, Rep. of Korea

[73] Assignee: Samsung Electronics, Co., Ltd., Suwon, Rep. of Korea

[21] Appl. No.: 08/896,756

[22] Filed: Jul. 18, 1997

[30] Foreign Application Priority Data

Oct. 10, 1996 [KR] Rep. of Korea ..................... 96-45132

[51] Int. Cl.$^6$ .................................................. H03K 3/353
[52] U.S. Cl. .......................................... 327/313; 327/328
[58] Field of Search ............................ 327/99, 108, 112, 327/206, 276–278, 281, 285, 288, 312, 316, 323, 409, 427, 434, 437; 326/83–87

[56] References Cited

U.S. PATENT DOCUMENTS 5,329,174  7/1994  Chiang .................................... 327/313
5,576,654  11/1996  Shu et al. ................................ 327/433
5,600,271  2/1997  Erickson et al. ........................ 327/108
5,682,105  10/1997  Fujima ..................................... 326/30

*Primary Examiner*—My-Trang Nu Ton
*Attorney, Agent, or Firm*—Marger Johnson & McCollom, P.C.

[57] ABSTRACT

A mode setting circuit for generating a mode setting signal for selecting a particular operational mode in response to an input signal from a mode setting pad. The mode setting circuit includes a driver circuit for generating a mode setting signal in response to an input voltage of a mode setting pad, a first pull-down transistor for discharging a voltage at the mode setting pad, and a second pull-down transistor for discharging the voltage at the mode setting pad in response to a signal from the driver circuit. Such mode setting circuit can prevent a misoperation which may occasionally be caused by ground noises when the mode setting pad is not coupled to the supply voltage terminal. Thus, the reliability of the manufactured goods will be increased.

6 Claims, 2 Drawing Sheets

MODE SETTING CIRCUIT

BACKGROUND OF THE INVENTION

1. Field of the Invention

The present invention relates to a semiconductor memory device, and more particularly a mode setting circuit for generating a mode setting signal for selecting a particular operational mode in response to an input signal from a mode setting pad.

2. Description of the Related Art

Recently, with the rapid expansion of practical applications for semiconductor memory devices, various design technologies have been developed for realizing several operational modes into one chip. A memory device including various operational modes necessarily requires a mode setting circuit for selecting a particular operational mode. For example, there is a known method for bonding a mode setting pad to an external supply voltage terminal or a ground voltage terminal so as to generate a mode setting signal for selecting a particular operational mode. The mode setting circuit is commonly connected to the mode setting pad to generate the mode setting signal upon detecting an input voltage applied to the mode setting pad. Such mode setting circuit activates the mode setting signal to select a predetermined operational mode when the mode setting pad is coupled to the supply voltage terminal, and inactivates the mode setting signal when the mode setting pad is separated from the supply voltage terminal.

Generally, the mode setting circuit includes a driver circuit and a discharge transistor with a small channel size. When the mode setting pad is coupled to the supply voltage terminal, the driver circuit activates the mode setting signal to the high level. On the other hand, when the mode setting pad is not coupled to the supply voltage terminal, the small sized discharge transistor discharges the voltage at the mode setting pad so as to inactivate the mode setting signal to the low level.

Referring to FIG. 1, a mode setting circuit according to the prior art includes a mode setting pad 100, a discharge transistor 105, and a driver circuit. The discharge transistor 105 has a source-drain channel connected between the mode setting pad 100 and the ground node, and a gate connected to an internal voltage VIN generated internally within a chip. Since the gate of the discharge transistor 105 is provided with the internal voltage VIN, the discharge transistor 105 is normally turned on. Further, the discharge transistor 105 has a very small channel size so as to discharge the voltage at the mode setting pad 100 into the ground node by way of the source-drain channel when the mode setting pad 100 is not coupled to the supply voltage terminal. When the mode setting pad 100 is coupled to the supply voltage terminal, the driver circuit transfers the voltage level at the mode setting pad 100 to an output terminal "OUT" of the mode setting circuit. The driver circuit generally includes a first inverter connected between the mode setting pad 100 and a node N1, and a second inverter connected to the node N1. The first inverter usually includes a pull-up PMOS transistor 101 and a pull-down NMOS transistor 102 serially connected between the supply voltage and the ground voltage. The second inverter includes a pull-up PMOS transistor 103 and a pull-down NMOS transistor 104 serially connected between the supply voltage and the ground node.

In operation, when the mode setting pad 100 is coupled to the supply voltage terminal, the first inverter generates the low level and the second inverter generates a mode setting signal OUT activated to the high level. In the meantime, the discharge transistor 105 is continuously turned on. However, since the channel size of the discharge transistor 105 is very small, the voltage at the mode setting pad 100 can be maintained at the high level.

On the other hand Alternatively, when the mode setting pad 100 is not coupled to the supply voltage terminal, the voltage at the mode setting pad 100 is discharged into the ground node through the source-drain channel of the pull-down transistor 105 which is normally turned on. Thus, the voltage at the mode setting pad 100 is firmly maintained at the low level. Then, the first inverter maintains the node N1 at the high level, and the second inverter inactivates the mode setting signal OUT to the low level.

In practice, however, problems may arise with this arrangement because the pull-down transistor 105 and the driver circuit often share the same ground node in order to minimize a layout area. Thus, when ground noise is generated from other circuits sharing the same ground node within the chip, the mode setting circuit may be adversely influenced. For example, if the ground node voltage rises above the threshold voltage Vth of the NMOS transistor due to the ground noises, the gate-source voltage Vgs of the pull-down NMOS transistor 102 becomes higher than the threshold voltage Vth of the NMOS transistor. Accordingly, the pull-down NMOS transistor 102 is undesirably turned on and the second inverter erroneously activates the mode setting signal OUT to the high level. In other words, the mode setting circuit may erroneously select a particular operational mode, even though the mode setting pad 100 is not coupled to the supply voltage terminal. Such misoperation may cause a fatal defect of the chip.

SUMMARY OF THE INVENTION

It is therefore an object of the present invention to provide a reliable mode setting circuit.

It is another object of the present invention to provide a mode setting circuit for generating a mode setting signal which is stable against ground noises.

According to an aspect of the present invention, a mode setting circuit includes a driver circuit for generating a mode setting signal in response to an input voltage of a mode setting pad, a first pull-down transistor for discharging a voltage at the mode setting pad, and a second pull-down transistor for discharging the voltage at the mode setting pad in response to a signal from the driver circuit.

BRIEF DESCRIPTION OF THE DRAWINGS

The above and other objects, features and advantages of the present invention will become more apparent in the light of the following detailed description of an exemplary embodiment thereof taken with the attached drawings in which.

DETAILED DESCRIPTION OF THE PREFERRED EMBODIMENTS

Figure 1:
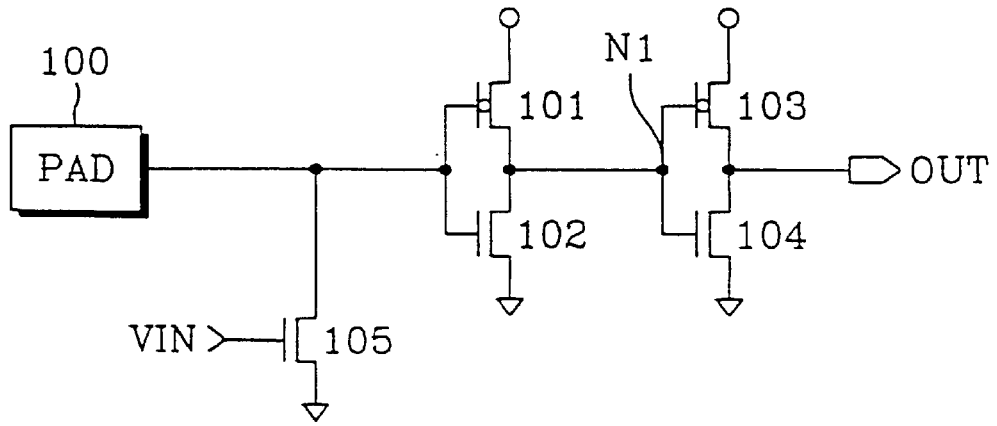
FIG. 1 is a detailed circuit diagram of a mode setting circuit according to the prior art.

Preferred embodiments of the present invention will be described in detail hereinbelow with reference to the attached drawings, in which the like reference numerals represent the like elements.

Figure 2:
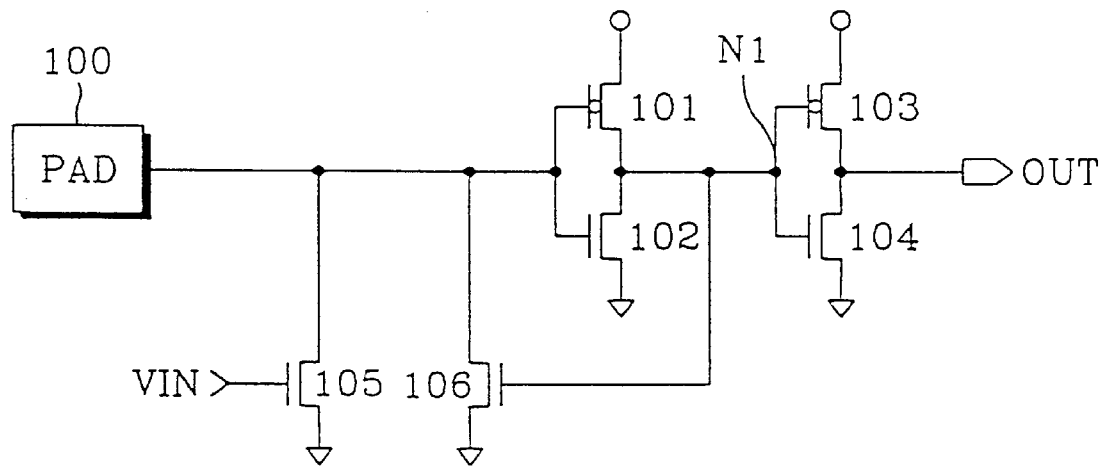
FIG. 2 is a detailed circuit diagram of a mode setting circuit according to an embodiment of the present invention.

Referring to FIG. 2, a mode setting circuit according to one embodiment of the present invention includes a pull-down transistor 105 connected between a mode setting pad 100 and the ground node, and a driver circuit comprised of first and second inverters connected in series between the mode setting pad 100 and an output terminal. The pull-down transistor 105 has a very small sized channel, so that a turn-on channel resistance thereof is very high. Like the prior art mode setting circuit as shown in FIG. 1, the first inverter includes a pull-up PMOS transistor 101 and a pull-down NMOS transistor 102 connected in series between the supply voltage and the ground voltage, and the second inverter includes a pull-up PMOS transistor 103 and a pull-down NMOS transistor 104 connected between the supply voltage and the ground node. In addition, the mode setting circuit includes an NMOS transistor 106 having a source-drain channel connected between the mode setting pad 100 and the ground node and a gate connected to a node N1. The NMOS transistor 106 has a large sized channel, so that a turn-on channel resistance thereof is very low. The node N1 is formed at a conjunction of the first and second inverters.

In operation, when the mode setting pad 100 is coupled to the supply voltage terminal, the first inverter inverts the high level voltage of the mode setting pad 100, resulting in a low voltage level at node N1. The second inverter inverts the output of the first inverter to generate a mode setting signal OUT activated to the high level. The NMOS transistor 106 is turned off, since the node N1 is at the low level. However, since the pull-down transistor 105 is continuously turned on and the channel resistance of the pull-down transistor 105 is very high, the mode setting pad 100 is maintained at the high level.

When the mode setting pad 100 is not coupled to the supply voltage terminal, the voltage at the mode setting pad 100 is discharged into the ground node through the source-drain channel of the pull-down transistor 105 which is normally turned on. Thus, the voltage at the mode setting pad 100 is firmly maintained at the low level. Then, the first inverter maintains the node N1 at the high level, and the second inverter generates the mode setting signal OUT inactivated to the low level. At the same moment, the NMOS transistor 106, being provided with the high level at the gate, is turned on. Since the NMOS transistor 106 has a very low turn-on channel resistance, the voltage level at the mode setting pad 100 can be firmly maintained at the low level. In the meantime, if the ground node voltage rises above the threshold voltage Vtn of the NMOS transistor 102 due to the ground noises, the voltage level at the mode setting pad 100 rapidly follows the fluctuation of the ground voltage level because of the addition of the NMOS transistor 106. Thus, the gate-source voltage of the pull-down NMOS transistor 102 can not become higher than the threshold voltage Vtn of the NMOS transistor. Accordingly, the pull-down NMOS transistor 102 is never turned on in response to the ground noises. As a result, the mode setting signal OUT is reliably maintained at the inactivated low level.

Figure 3:
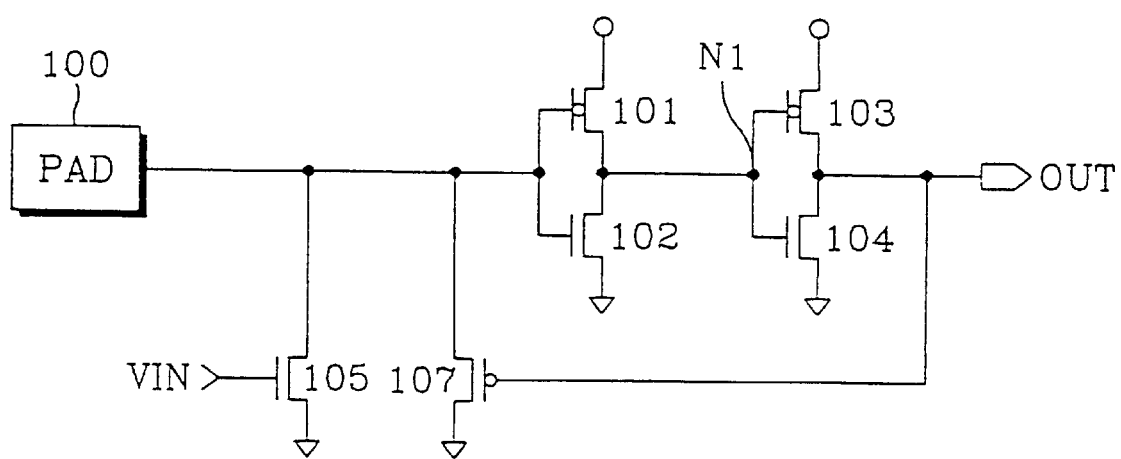
FIG. 3 is a detailed circuit diagram of a mode setting circuit according to another embodiment of the present invention.

Referring to FIG. 3, a mode setting circuit according to another embodiment of the present invention includes a PMOS transistor 107 in place of the NMOS transistor 106 shown in FIG. 2. The PMOS transistor 107 has a source-drain channel connected between the mode setting pad 100 and the ground node and a gate connected to the output of the second inverter. Likewise, the PMOS transistor 107 has a large sized channel, so that a turn-on channel resistance thereof is very low.

In operation, when the mode setting pad 100 is coupled to the supply voltage terminal, the mode setting circuit operates in the same way as described hereinabove with reference to FIG. 2. Alternatively, when the mode setting pad 100 is not coupled to the supply voltage terminal, the voltage at the mode setting pad 100 is discharged into the ground node by the pull-down transistor 105 which is normally turned on. Then, the first inverter generates the high level at the node N1 and the second inverter generates the mode setting signal OUT inactivated to the low level. The mode setting signal OUT of the low level turns on the PMOS transistor 107. Since the PMOS transistor 107 has a very low turn-on channel resistance, the voltage level at the mode setting pad 100 can rapidly follow the fluctuation of the ground voltage level which may be caused by the ground noises. Thus, a gate-source voltage of the pull-down NMOS transistor 102 cannot become higher than the threshold voltage Vtn of the NMOS transistor. Accordingly, the pull-down NMOS transistor 102 is never turned on in response to the ground noises. As a result, the mode setting signal OUT is reliably maintained at the inactivated low level.

As described in the foregoing, the present invention can prevent a misoperation of the mode setting circuit which may be caused occasionally by the ground noises when the mode setting pad is not coupled to the supply voltage terminal. Thus, the reliability of the manufactured goods will be increased.

The preferred embodiments are given by way of example only, as a means for explaining the use and construction of the present invention. The embodiments are subject to routine modification by those of ordinary skill in the art. The present invention is not limited to the illustrative embodiments, but rather is defined by the appended claims.

What is claimed is:

1. A mode setting circuit for generating a mode setting signal for selecting a predetermined operational mode in response to an input signal from a mode setting pad, comprising:

driver means for generating said mode setting signal in response to said input signal, the driver means including:
      a first inverter connected between said mode setting pad and a node, for inverting the input signal; and
      a second inverter connected to said node, for inverting an output signal of said first inverter to generate said mode setting signal;
   a first NMOS pull-down transistor for discharging a voltage at the mode setting pad in response to a constant predetermined reference voltage received at a gate, said first pull-down transistor having a channel connected between the mode setting pad and a ground node; and
   a second NMOS pull-down transistor for discharging the voltage at the mode setting pad in response to a signal from said driver means, the second NMOS pull-down transistor having a gate connected to the node and a source-drain channel connected between the mode setting pad and the ground node;
   wherein said input signal is a high voltage received when the mode setting pad is coupled to a supply voltage terminal; and wherein a channel size of the first NMOS pull-down transistor being smaller than a channel size of the second NMOS pull-down transistor.

2. A mode setting circuit for generating a mode setting signal for selecting a predetermined operational mode in response to an input signal from a mode setting pad, comprising:

a first inverter connected between the mode setting pad and a node for inverting the input signal;

a second inverter connected to the node for inverting an output signal from the first inverter and generating the mode setting signal;

a first NMOS pull-down transistor for discharging a voltage at the mode setting pad in response to a constant predetermined reference voltage, said first pull-down transistor being connected between the mode setting pad and a ground node; and a second PMOS pull-down transistor for discharging the voltage at the mode setting pad in response to a signal from the second inverter, the second PMOS transistor having a gate connected to receive the mode setting signal and a source-drain channel connected between the mode setting pad and a ground node.

3. A mode setting circuit according to claim 2, wherein a channel size of said first NMOS pull-down transistor is smaller than a channel size of said second PMOS pull-down transistor.

4. A mode setting circuit for generating a mode setting signal for selecting a predetermined operational mode in response to an input signal from a mode setting pad, comprising:

a first inverter for inverting said input signal, said first inverter being connected between said mode setting pad and a node;

a second inverter connected to said node, for inverting an output of said first inverter to generate the mode setting signal;

a first NMOS pull-down transistor connected between said mode setting pad and a ground node, for discharging said input signal in response to an internal signal generated internally within a chip; and a second PMOS pull-down transistor connected between said mode setting pad and the ground node for discharging said input signal in response to an output of said second inverter, a channel size of the first NMOS pull-down transistor being smaller than a channel size of the second PMOS transistor.

5. A mode setting circuit for generating a mode setting signal for selecting a predetermined operational mode in response to an input signal from a mode setting pad, comprising:

a first MOS inverter for inverting said input signal, said first inverter being connected between said mode setting pad and a node;

a second MOS inverter connected to said node, for inverting an output of said first inverter to generate the mode setting signal;

a first NMOS pull-down transistor connected between said mode setting pad and a ground node, for discharging said input signal in response to an internal signal generated internally within a chip; and a second PMOS pull-down transistor connected between said mode setting pad and the ground node, for discharging said input signal in response to said mode setting signal generated from said second inverter.

6. A mode setting circuit according to claim 5, wherein a channel size of said first pull-down transistor is smaller than a channel size of said second pull-down transistor.

* * * * *